(12) United States Patent
Lee

(10) Patent No.: US 9,362,435 B2
(45) Date of Patent: Jun. 7, 2016

(54) SOLAR CELL APPARATUS AND METHOD OF FABRICATING THE SAME

(75) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 114 days.

(21) Appl. No.: 14/351,842

(22) PCT Filed: Jun. 19, 2012

(86) PCT No.: PCT/KR2012/004835
§ 371 (c)(1),
(2), (4) Date: Jul. 15, 2014

(87) PCT Pub. No.: WO2013/055004
PCT Pub. Date: Apr. 18, 2013

(65) Prior Publication Data
US 2014/0360580 A1    Dec. 11, 2014

(30) Foreign Application Priority Data

Oct. 13, 2011 (KR) .................. 10-2011-0104740

(51) Int. Cl.
*H01L 31/048* (2014.01)
*H01L 31/02* (2006.01)

(52) U.S. Cl.
CPC ........ *H01L 31/0481* (2013.01); *H01L 31/0201* (2013.01); *H01L 31/048* (2013.01); *Y02E 10/50* (2013.01)

(58) Field of Classification Search
CPC .............. H01L 31/048; H01L 31/0481; H01L 31/0203; H01L 33/52
USPC ......................... 136/251, 252, 259
See application file for complete search history.

(56) References Cited

U.S. PATENT DOCUMENTS

| | | | |
|---|---|---|---|
| 5,397,401 A * | 3/1995 | Toma ................ | H01B 3/44 136/251 |
| 6,300,555 B1 | 10/2001 | Kondo et al. | |
| 2006/0225777 A1 | 10/2006 | Buechel | |
| 2008/0156365 A1 | 7/2008 | Scholz et al. | |
| 2010/0059102 A1* | 3/2010 | Yagiura ............. | H01L 31/048 136/244 |
| 2010/0200048 A1 | 8/2010 | Taruno et al. | |
| 2010/0300528 A1 | 12/2010 | Fujii | |
| 2010/0308262 A1 | 12/2010 | Rondena et al. | |
| 2011/0303276 A1 | 12/2011 | Fujii | |

FOREIGN PATENT DOCUMENTS

| | | |
|---|---|---|
| CN | 101803040 A | 8/2010 |
| JP | 2002141543 A | 5/2002 |
| JP | 2008-536310 A | 9/2008 |
| JP | 2010-278358 A | 12/2010 |
| JP | 2010-541262 A | 12/2010 |
| WO | WO-2010/073673 A1 | 7/2010 |

OTHER PUBLICATIONS

International Search Report in International Application No. PCT/KR2012/004835, filed Jun. 19, 2012.
Office Action dated Sep. 14, 2015 in Chinese Application No. 201280060723.X.

* cited by examiner

*Primary Examiner* — Susan D Leong
(74) *Attorney, Agent, or Firm* — Saliwanchik, Lloyd & Eisenschenk

(57) ABSTRACT

Disclosed are a solar cell apparatus and a method of fabricating the same. The solace cell apparatus includes a solar cell on a support substrate; a polymer resin layer on the solar cell; a protective panel on the polymer resin layer; and a composite protective layer at each lateral side of the support substrate, the solar cell, the polymer resin layer, and the protective panel.

15 Claims, 2 Drawing Sheets

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/004835, filed Jun. 19, 2012, which claims priority to Korean Application No. 10-2011-0104740, filed Oct. 13, 2011, the disclosures of each of which are incorporated herein by reference in their entirety.

TECHNICAL FIELD

The embodiment relates to a solar cell apparatus and a method of fabricating the same.

BACKGROUND ART

Solar cells may be defined as devices to convert light energy into electrical energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

The minimum unit of the solar cell is a cell. In general, one cell generates a very small voltage of about 0.5V to about 0.6V. Therefore, a panel-shape structure of connecting a plurality of cells to each other in series on a substrate to generate voltages in a range of several voltages to several hundreds of voltages is referred to as a module, and a structure having several modules installed in a frame is referred to as a solar cell apparatus.

Typically, the solar cell apparatus has a structure of glass/filling material (ethylene vinyl acetate, EVA)/solar cell module/filling material (EVA)/surface material (back sheet).

In general, the glass includes low-iron tempered glass. The glass must represent high light transmittance and be treated to reduce the surface reflection loss of incident light. The EVA used as the filling material is interposed between the front/rear side of the solar cell and the back sheet to protect a fragile solar cell device. When the EVA is exposed to UV light for a long time, the EVA may be discolored, and the moisture proof performance of the EVA may be degraded. Accordingly, when the module is fabricated, it is important to select a process suitable for the characteristic of the EVA sheet so that the life span of the module can be increased, and the reliability of the module can be ensured. The back sheet is placed on a rear side of the solar cell module. The back sheet must represent superior adhesive strength between layers, must be easily handled, and must protect the solar cell device from an external environment.

The solar cell apparatus must have resistance against external moisture ($H_2O$) or external oxygen ($O_2$), and the problem related to the reliability must be solved in order to improve the performance of the solar cell. According to the related art, in order to solve the above problem, a sealing treatment is performed with respect to the solar cell apparatus. However, even though the solar cell is sealed, moisture is infiltrated into the solar cell apparatus along the interfacial surface between a substrate and a sealing member, so that a solar cell electrode is corroded, thereby degrading the performance of the solar cell apparatus.

DISCLOSURE OF INVENTION

Technical Problem

The embodiment provides a solar cell apparatus capable of improving the reliability and stability and a method of fabricating the same.

Solution to Problem

A solar cell apparatus according to the embodiment includes a solar cell on a support substrate; a polymer resin layer on the solar cell; a protective panel on the polymer resin layer; and a composite protective layer at each lateral side of the support substrate, the solar cell, the polymer resin layer, and the protective panel.

A method of fabricating a solar cell apparatus according to the embodiment includes the steps of forming a solar cell on a support substrate; forming a polymer resin layer on the solar cell; forming a protective panel on the polymer resin layer; and forming a composite protective layer at each lateral side of the support substrate, the solar cell, the polymer resin layer, and the protective panel.

Advantageous Effects of Invention

According to the solar cell apparatus of the embodiment, a composite protective layer including a metal layer and a metal oxide layer is formed at a lateral side of the solar cell, thereby minimizing the infiltration of moisture ($H_2O$) or oxygen ($O_2$) into the solar cell. That is, the solar cell apparatus according to the embodiment uses the composite protective layer, which has chemical or physical compactness higher than that of a conventional protective layer, so the stability and reliability of the device can be significantly improved.

In addition, according to the method of fabricating the solar cell apparatus of the embodiment, the composite protective layer can be formed by simply oxidizing an inexpensive metal, so the cost for materials and the manufacturing cost can be reduced.

MODE FOR THE INVENTION

Figure 1:
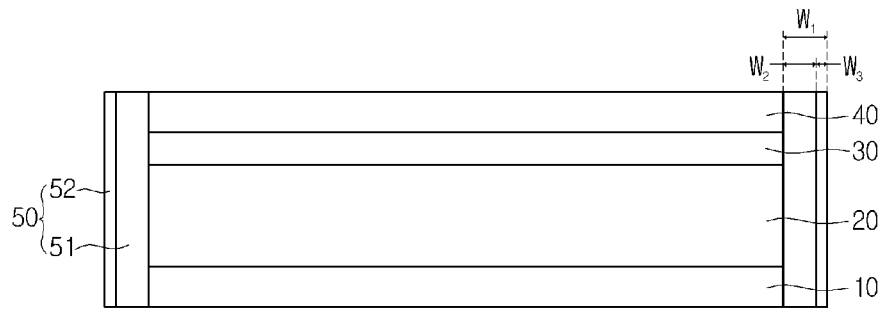
FIGS. 1 to 3 are sectional views showing a solar cell apparatus according to the embodiment.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

Figure 2:
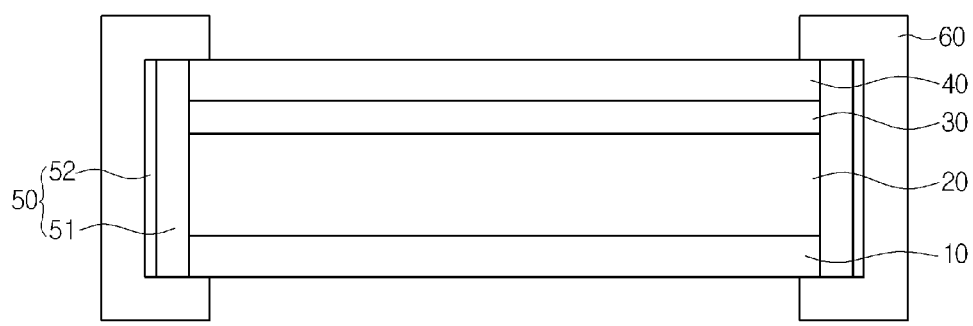
Figure 3:
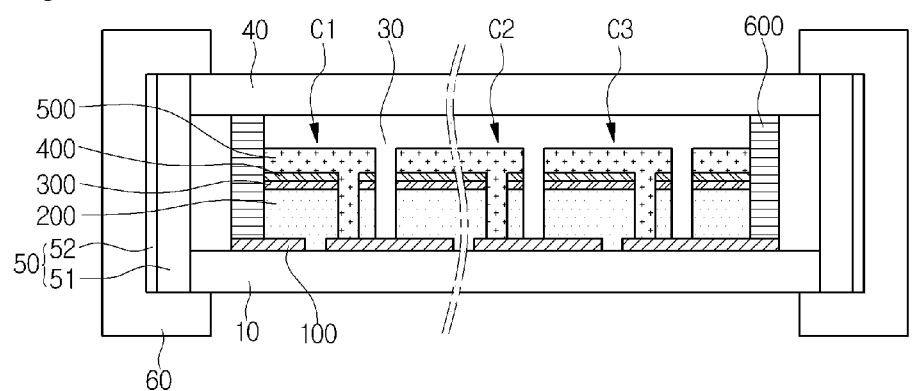

FIGS. 1 and 2 are sectional views showing a solar cell apparatus according to the embodiment and FIG. 3 is a sectional view showing a solar cell of the solar cell apparatus in more detail.

Referring to FIGS. 1 and 2, the solar cell apparatus according to the embodiment includes a support substrate 10, a solar cell 20, a polymer resin layer 30, a protective panel 40, a composite protective layer 50 and a frame 60.

The support substrate 10 has a plate shape and supports the solar cell 20, the polymer resin layer 30, the protective panel 40, the composite protective layer 50 and the frame 60.

The support substrate 10 may be a rigid panel or a flexible panel. In addition, the support substrate 10 may include an insulator. For example, the support substrate 10 may include a glass substrate, a plastic substrate, or a metallic substrate. In more detail, the support substrate 10 may include a soda lime glass substrate. In addition, the support substrate 10 may include a ceramic substrate including alumina, stainless steel, or polymer having a flexible property.

The solar cell 20 is formed on the support substrate 10. The solar cell includes a plurality of cells C1, C2, C3 ... and Cn, which are electrically connected with each other. Thus, the solar cell 20 can convert solar light into electric energy.

For instance, the cells C1, C2, C3 ... and Cn can be connected with each other in series, but the embodiment is not limited thereto. In addition, the cells C1, C2, C3 ... and Cn may extend in one direction in parallel to each other.

The solar cell 20 may be a CIGS solar cell including the group I-III-IV semiconductor compound, a silicon solar cell, or a dye-sensitized solar cell, but the embodiment is not limited thereto. In detail, the solar cell 20 includes the group I-III-IV semiconductor compound.

Referring to FIG. 3, the solar cell 20 includes a back electrode layer 100 formed on the support substrate 10, a light absorbing layer 200 formed on the back electrode layer 100, a buffer layer 300 formed on the light absorbing layer 200, a high-resistance buffer layer 400 formed on the buffer layer 300, a front electrode layer 500 formed on the high-resistance buffer layer 400, and a bus bar 600.

The back electrode layer 100 is provided on the support substrate 10. The back electrode layer 100 is a conductive layer. The back electrode layer 100 may include one selected from the group consisting of molybdenum (Mo), gold (Au), aluminum (Al), chrome (Cr), tungsten (W), and copper (Cu).

The light absorbing layer 200 is provided on the back electrode layer 100. The light absorbing layer 200 includes a group I-III-VI compound. For example, the light absorbing layer 200 may have the CIGSS $(Cu(IN,Ga)(Se,S)_2)$ crystal structure, the CISS $(Cu(IN)(Se,S)_2)$ crystal structure or the CGSS $(Cu(Ga)(Se,S)_2)$ crystal structure.

The buffer layer 300 is provided on the light absorbing layer 200. The buffer layer 300 may include CdS, ZnS, InXSY or InXSeYZn(O, OH). The high-resistance buffer layer 400 is disposed on the buffer layer 300. The high-resistance buffer layer 400 includes i-ZnO, which is not doped with impurities.

The front electrode layer 500 may include a transparent conductive material. In addition, the front electrode layer 500 may have the characteristics of an N type semiconductor. In this case, the front electrode layer 500 forms an N type semiconductor with the buffer layer 300 to make a PN junction with the light absorbing layer 200 serving as a P type semiconductor layer. For instance, the front electrode layer 500 may include aluminum-doped zinc oxide (AZO).

The bus bar 600 is disposed on the top surface or the lateral side of the solar cell 20 and electrically connected to the solar cell 20. The bus bar 600 is connected to a circuit board provided in a junction box (not shown) disposed at a rear of the support substrate through a wire.

The polymer resin layer 30 is disposed on the solar cell 20. In detail, the polymer resin layer 30 is disposed between the solar cell 20 and the protective panel 40. For instance, the polymer resin layer 30 can directly make contact with the top surface and/or the lateral side of the solar cell 20. The polymer resin layer 40 may improve the adhesive strength of the protective panel 40 and protect the solar cell 20 from external impact.

The polymer resin layer 30 is transparent and flexible. For instance, the polymer resin layer 30 may include transparent acryl, melamine, polystyrene, epoxy, polyvinylbutyral (PVB) or ethylenevinylacetate (EVA). In more detail, the polymer resin layer 30 can be formed by using an EVA film, but the embodiment is not limited thereto.

The protective panel 40 is disposed on the polymer resin layer 30. The protective panel 40 can protect the solar cell 20 from the external impact and/or impurities. The protective panel 40 is transparent. For instance, the protective panel 40 includes tempered glass. The tempered glass may include low-iron tempered glass.

The composite protective layer 50 is disposed at lateral sides of the support substrate 10, the solar cell 20, the polymer resin layer 30 and the protective panel 40. In detail, the composite protective layer 50 is disposed at the lateral side of the support substrate 10, at the lateral side of the solar cell 20, at the lateral side of the polymer resin layer 30 and at the lateral side of the protective panel 40.

Referring to FIGS. 1 and 2, the lateral side of the support substrate 10, the lateral side of the solar cell 20, the lateral side of the polymer resin layer 30 and the lateral side of the protective panel 40 may have a cutting surface having the same shape when viewed from the top. The composite protective layer 50 can directly make contact with the lateral side of the support substrate 10, the lateral side of the solar cell 20, the lateral side of the polymer resin layer 30 and the lateral side of the protective panel 40, respectively.

In contrast, the lateral side of the support substrate 10, the lateral side of the solar cell 20, the lateral side of the polymer resin layer 30 and the lateral side of the protective panel 40 may not be formed on the same plane. In this case, the composite protective layer 50 directly makes contact with the outermost layer from among the support substrate 10, the solar cell 20, the polymer resin layer 30 and the protective panel 40. For instance, as shown in FIG. 3, when a part of the polymer resin layer 30 is formed at the lateral side of the solar cell 20, the composite protective layer 50 directly makes contact with the lateral side of the support substrate 10, the lateral side of the polymer resin layer 30 and the lateral side of the protective panel 40, respectively.

In addition, the composite protective layer 50 may be disposed on at least one lateral side of the solar cell 20, the polymer resin layer 30 and the protective panel 40. In more detail, preferably, the composite protective layer 50 is disposed at all lateral sides of the solar cell 20, the polymer resin layer 30, and the protective panel 40. That is, the composite protective layer 50 is disposed at four lateral sides of the solar cell 20, four lateral sides of the polymer resin layer 30, and four lateral sides of the protective panel 40, respectively.

The composite protective layer 50 may include a metal layer 51 and a metal oxide layer 52 formed on the metal layer 51. The metal oxide layer 52 may be formed by oxidizing the metal layer 51. That is, the metal layer 51 and the metal oxide layer 52 may include the same metallic component.

The metal layer 51 can be formed by using various metals if the metals can be readily oxidized in the atmosphere to form an oxide layer. For instance, the metal layer 51 may include one selected from the group consisting of Al, an Al alloy, Ga, In, Mg, Zn and a combination thereof. In addition, the metal oxide layer 52 can be formed by oxidizing one selected from the group consisting of Al, an Al alloy, Ga, In, Mg, Zn and a combination thereof.

In more detail, the metal layer 51 is an Al layer and the metal oxide layer 52 is an Al oxide layer ($Al_2O_3$), but the embodiment is not limited thereto.

The composite protective layer 50 may have a thickness W1 in the range of about 1 μm to about 100 μm. In more detail, the composite protective layer 50 may have a thickness W1 in the range of about 1 μm to about 10 μm, but the embodiment is not limited thereto. In addition, a ratio of a thickness W3 of the metal oxide layer to a thickness W2 of the metal layer is in the range of about 1:5 to about 1:10, but the embodiment is not limited thereto.

Although the above description has been made based on the single composite protective layer 50, the embodiment is not limited thereto. For instance, the composite protective layer 50 according to the embodiment may include a plurality of layers. In detail, the composite protective layer 50 can be formed by repeatedly laminating a plurality of metal layers 51 and a plurality of metal oxide layers 52.

The composite protective layer 50 can prevent the degradation of the electric characteristics of the solar cell, which is caused by the moisture ($H_2O$) or oxygen ($O_2$) that oxidizes the solar cell. In particular, the composite protective layer 50 can readily block the moisture ($H_2O$) or oxygen ($O_2$) infiltrated from the lateral side of the solar cell apparatus.

In addition, the composite protective layer 50 including the metal layer 51 and the metal oxide layer 52 has chemical or physical compactness higher than that of a conventional sealing agent. Thus, the composite protective layer 50 can effectively protect the solar cell from the moisture and oxygen, so that the stability and reliability of the device can be significantly improved.

The frame 60 receives and supports the support substrate 10, the solar cell 20, the polymer resin layer 30, the protective layer 40 and the composite protective layer 50. The frame 60 may surround the composite protective layer 50. That is, as shown in FIGS. 1 to 3, the frame 60 directly makes contact with the top surface and both lateral sides of the composite protective layer 50. In addition, the frame 60 may be formed on the protective panel 40 and the support substrate 10, but the embodiment is not limited thereto.

FIGS. 4 to 7 are sectional views showing the method of fabricating the solar cell apparatus according to the embodiment. The above description about the solar cell apparatus will be incorporated herein by reference.

Figure 4:
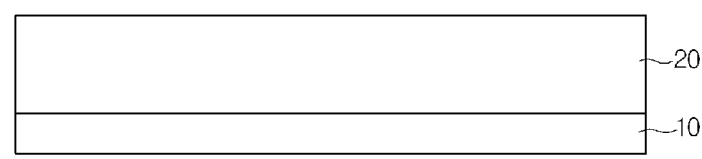
FIGS. 4 to 7 are sectional views showing a method of fabricating a solar cell apparatus according to the embodiment.
Figure 5:
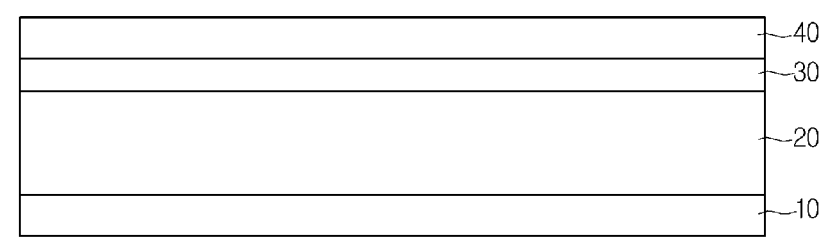

Referring to FIGS. 4 and 5, the solar cell 20, the polymer resin layer 30, and the protective layer 40 are sequentially formed on the support substrate 10. In detail, the solar cell 20 can be formed through the steps of forming the back electrode layer 100 on the support substrate 10, forming the light absorbing layer 200 on the back electrode layer 100, and forming the front electrode layer 400 on the light absorbing layer 200. The method of forming the solar cell 200 is disclosed in Korean Patent Registration No. 10-0999810 in detail, but the embodiment is not limited thereto. In addition, the polymer resin layer 30 can be formed through the lamination process. For instance, the polymer resin layer 30 can be formed by sequentially laminating the EVA film and the tempered glass on the solar cell 20 and then heat-treating the resultant structure for about 1 hour to about 2 hours at the temperature of about 100° C. to about 200° C.

Figure 6:
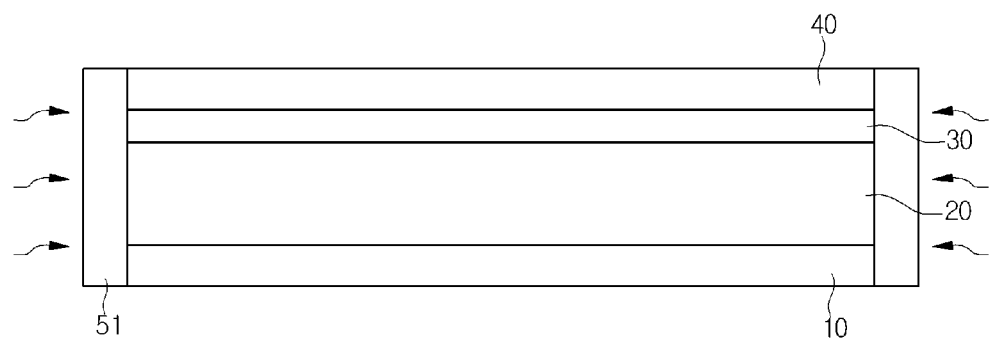
Figure 7:
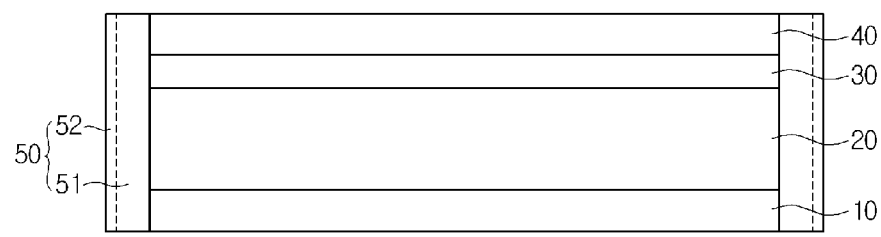

Referring to FIGS. 6 and 7, the composite protective layer 50 is formed at each lateral side of the support substrate 10, the solar cell 20, the polymer resin layer 30, and the protective layer 40. In detail, the composite protective layer 50 can be formed through the steps of forming the metal layer 51 and forming the metal oxide layer 52 by oxidizing the metal layer 51.

The method of forming the metal layer generally known in the art can be used, without specific limitation, as the method of forming the metal layer 51 at each lateral side of the support substrate 10, the solar cell 20, the polymer resin layer 30, and the protective layer 40. For instance, the metal layer 51 can be fabricated through the sputtering scheme, the physical vapor deposition (PVD) scheme, the chemical vapor deposition (CVD) scheme or the atomic layer deposition (ALD) scheme.

In addition, the metal layer 51 can be formed by coating a metal paste and then baking the metal paste. The metal paste may include metal powder, an organic vehicle or an inorganic binder.

The metal powder has a diameter in the range of about 2 μm to about 20 μm. The metal powder may have a spherical shape, a plate shape or a column shape. In addition, the metal powder can be mixed at the amount of about 20 wt % to about 50 wt %.

The inorganic binder may include PbO—SiO2-based glass frit, PbO—$SiO_2$—$B_2O_3$-based glass frit, ZnO—$SiO_2$-based glass frit, ZnO—$B_2O_3$—$SiO_2$-based glass frit, or $Bi_2O_3$—$B_2O_3$—ZnO—$SiO_2$-based glass frit. In addition, the inorganic binder can be mixed at the amount of about 1 wt % to about 20 wt % and has the softening point of about 300° C. to about 600° C.

Referring to FIG. 7, after forming the metal layer 51 at each lateral side of the support substrate 10, the solar cell 20, the polymer resin layer 30, and the protective layer 40, the metal layer 51 is oxidized to form the metal oxide layer 52. The metal layer 51 can be oxidized through various schemes without specific limitations. For instance, the metal oxide layer 52 can be naturally formed by oxidizing the metal layer 51 in the atmosphere. The composite protective layer 50 may have various thickness ratios by adjusting the oxidization degree of the metal layer 51. For instance, the ratio of the thickness W3 of the metal oxide layer 52 to the thickness W2 of the metal layer 51 is in the range of about 1:5 to about 1:10, but the embodiment is not limited thereto.

As described above, according to the method of fabricating the solar cell apparatus of the embodiment, the composite protective layer can be formed through the simple process, so the cost for materials and the manufacturing cost can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
    a solar cell on a support substrate;
    a polymer resin layer on the solar cell;
    a protective panel on the polymer resin layer; and
    a composite protective layer at each lateral side of the support substrate, the solar cell, the polymer resin layer, and the protective panel,
    wherein the composite protective layer directly makes contact with the lateral side of the support substrate, the lateral side of the solar cell, the lateral side of the polymer resin layer, and the lateral side of the protective panel.

2. The solar cell apparatus of claim 1, wherein the composite protective layer comprises a metal layer and a metal oxide layer on the metal layer.

3. The solar cell apparatus of claim 2, wherein the composite protective layer includes one selected from the group consisting of Al, an Al alloy, Ga, In, Mg, Zn and a combination thereof.

4. The solar cell apparatus of claim 2, wherein the metal layer comprises Al, and the metal oxide layer includes aluminum oxide.

5. The solar cell apparatus of claim 1, wherein the composite protective layer has a thickness in a range of 1 μm to 100 μm.

6. The solar cell apparatus of claim 2, wherein the composite protective layer has a thickness in a range of 1 μm to 10 μm.

7. The solar cell apparatus of claim 2, wherein a ratio of a thickness of the metal oxide layer to a thickness of the metal layer is in a range of 1:5 to 1:10.

8. The solar cell apparatus of claim 1, further comprising a frame surrounding the composite protective layer.

9. The solar cell apparatus of claim 1, wherein lateral sides of the support substrate, the solar cell, the polymer resin layer and the protective panel are formed with cutting surfaces having a same shape when viewed from a top.

10. The solar cell apparatus of claim 1, wherein the support substrate includes a rigid panel or a flexible panel.

11. The solar cell apparatus of claim 1, wherein the polymer resin layer includes transparent acryl, melamine, polystyrene, epoxy, polyvinylbutyral (PVB) or ethylenevinylacetate (EVA).

12. The solar cell apparatus of claim 2, wherein the metal oxide layer is formed by oxidizing the metal layer.

13. The solar cell apparatus of claim 3, wherein the metal layer and the metal oxide layer include the same metallic component.

14. The solar cell apparatus of claim 1, wherein the composite protective layer includes a plurality of layers.

15. The solar cell apparatus of claim 1, wherein the composite protective layer is formed by repeatedly laminating a plurality of metal layers and a plurality of metal oxide layers.

* * * * *